(12) United States Patent
Tsai

(10) Patent No.: US 7,663,080 B2
(45) Date of Patent: Feb. 16, 2010

(54) LIGHT SENSOR ASSEMBLY HAVING LIGHT-SENSING PORTION AND COMPENSATING UNIT AND DISPLAY DEVICE USING SAME

(75) Inventor: Hung-Chang Tsai, Miao-Li (TW)

(73) Assignee: Innolux Display Corp., Miao-Li County (TW)

( * ) Notice: Subject to any disclaimer, the term of this patent is extended or adjusted under 35 U.S.C. 154(b) by 0 days.

(21) Appl. No.: 12/080,892

(22) Filed: Apr. 7, 2008

(65) Prior Publication Data
US 2008/0245948 A1    Oct. 9, 2008

(30) Foreign Application Priority Data
Apr. 6, 2007  (CN) .................. 2007 1 0073960

(51) Int. Cl.
  *G09G 3/36* (2006.01)
  *G02F 1/1343* (2006.01)
(52) U.S. Cl. .................. 250/205; 250/216; 345/102; 257/434

(58) Field of Classification Search .................. 250/205, 250/216; 345/102, 207; 257/290, 431, 434
See application file for complete search history.

(56) References Cited

U.S. PATENT DOCUMENTS

| | | | |
|---|---|---|---|
| 6,489,631 B2 | 12/2002 | Young et al. | |
| 7,453,424 B2 * | 11/2008 | Johnson et al. | ................ 345/76 |
| 7,462,811 B2 * | 12/2008 | Cok et al. | ............. 250/214 AL |
| 7,474,283 B2 * | 1/2009 | Fish | ............................ 345/76 |
| 7,498,649 B2 * | 3/2009 | Koide et al. | .................. 257/458 |
| 7,538,305 B2 * | 5/2009 | Shin | ............................ 250/205 |

\* cited by examiner

*Primary Examiner*—Seung C Sohn
(74) *Attorney, Agent, or Firm*—Wei Te Chung

(57) ABSTRACT

An exemplary light sensor (20) includes a supporting base, a light-sensing unit (21) provided at at least one first location of the supporting base where ambient light is received, and a compensating unit (22) provided at a second location of the supporting base shielded from ambient light, the compensating unit having a structure that is the same as the light-sensing portion. The light-sensing portion includes at least one amorphous silicon thin film transistor (TFT) (210) configured for sensing light, and the compensating unit is configured for providing a reference value current for the light-sensing unit. A display device using the light sensor is also provided.

19 Claims, 7 Drawing Sheets

LIGHT SENSOR ASSEMBLY HAVING LIGHT-SENSING PORTION AND COMPENSATING UNIT AND DISPLAY DEVICE USING SAME

FIELD OF THE INVENTION

The present invention relates to light sensors, and more particularly to a light sensor having a light-sensing unit and a compensating unit, and a display device using the light sensor.

GENERAL BACKGROUND

Because LCD devices have the advantages of portability, low power consumption, and low radiation, they have been widely used in various portable information products such as notebooks, personal digital assistants (PDAs), video cameras, and the like. Furthermore, LCD devices are considered by some to have the potential to completely replace CRT (cathode ray tube) monitors and televisions.

Brightness is an important parameter to evaluate the performance of a display of an LCD device. A user may adjust the brightness of the display device according to the prevailing operational environment in which he/she is viewing the display device.

Referring to FIG. 9, a conventional LCD device 1 includes a liquid crystal panel 11, and a backlight module 12 disposed under the liquid crystal panel 11 for illuminating the liquid crystal panel 11.

Also referring to FIG. 10, the backlight module 12 includes a light source 121, a brightness detector 122, and a control circuit 123. The brightness detector 122 detects a brightness of ambient light of the LCD device 1, generates a corresponding photocurrent, and transmits the photocurrent to the control circuit 123. The control circuit 123 stores a plurality of reference values, the reference values having a function with photocurrent values. The control circuit 123 calculates a result according to the function of the reference values and the received photocurrent, generates a corresponding voltage signal, and adjusts the brightness of the light source 121 according to the voltage signal. Thereby, a brightness of the light beams emitted by the light source 121 corresponds with the brightness of the ambient light.

As detailed above, the LCD device 1 automatically adjusts the brightness of light provided by the backlight module 12 according to the brightness of the ambient light. However, the internal element parameters of the brightness detector 122 may change due to changes in the ambient environment such as changes in temperature. When this happens, the photocurrent generated by the brightness detector 122 does not necessarily accurately reflect the brightness of the ambient light. Further, the reference values stored in the control circuit 123 are changeless. Thus the control circuit 123 may not accurately adjust the brightness of the light source 121 to correspond with the brightness of the ambient light. Furthermore, the backlight module 12 also includes other components such as a plastic frame, a metal bottom plate, and various kinds of optical films. All together, the brightness detector 122, the control circuit 123 and the other components make the backlight module 12 rather complicated and bulky. This correspondingly makes the structure of the LCD device 1 unduly complicated and bulky.

What is needed, therefore, is a means or mechanism which can overcome the above-described deficiencies. What is also needed is a display device employing such means or mechanism.

SUMMARY

In one aspect, a light sensor includes a supporting base, a light-sensing portion provided at at least one first location of the supporting base where ambient light is received, and a compensating unit provided at a second location of the supporting base shielded from ambient light, the compensating unit having a structure that is the same as the light-sensing portion. The light-sensing portion includes at least one amorphous silicon thin film transistor (TFT) configured for sensing light, and the compensating unit is configured for providing a reference value current for the light-sensing portion.

In another aspect, a display device includes a first substrate, a second substrate parallel to the first substrate, a black matrix disposed at an inner surface of the first substrate, and a light sensor disposed at an inner surface of the second substrate. The light sensor includes a light-sensing unit and a compensating unit, the compensating unit has a structure that is the same as the light-sensing unit. The black matrix includes an opening, and the opening is disposed corresponding to the light-sensing unit. The black matrix is configured for shielding the compensating unit from ambient light, the opening is configured for providing a light path for the light-sensing unit, and the compensating unit is configured for providing a reference value current for the light-sensing unit.

In still another aspect, a display device includes a first substrate, a second substrate parallel to the first substrate, a black matrix disposed at an inner surface of the first substrate, a color filter disposed alternately with the black matrix at the inner surface of the first substrate, and a light sensor disposed at an inner surface of the second substrate. The light sensor includes a first light-sensing unit, a second light-sensing unit, and a compensating unit, the compensating unit has a structure that is the same as each of the first and second light-sensing units. The black matrix includes an opening, and the opening is disposed corresponding to the first light-sensing unit. The black matrix is configured for shielding the compensating unit from ambient light, the opening is configured for providing a light path for the first light-sensing unit, the color filter is configured for providing a light path for the second light-sensing unit, and the compensating unit is configured for providing a reference value current for the light-sensing unit.

Other novel features and advantages will become more apparent from the following detailed description when taken in conjunction with the accompanying drawings. In the drawings, all the views are schematic.

DETAILED DESCRIPTION OF PREFERRED EMBODIMENTS

Reference will now be made to the drawings to describe various embodiments of the present invention in detail.

Figure 1:
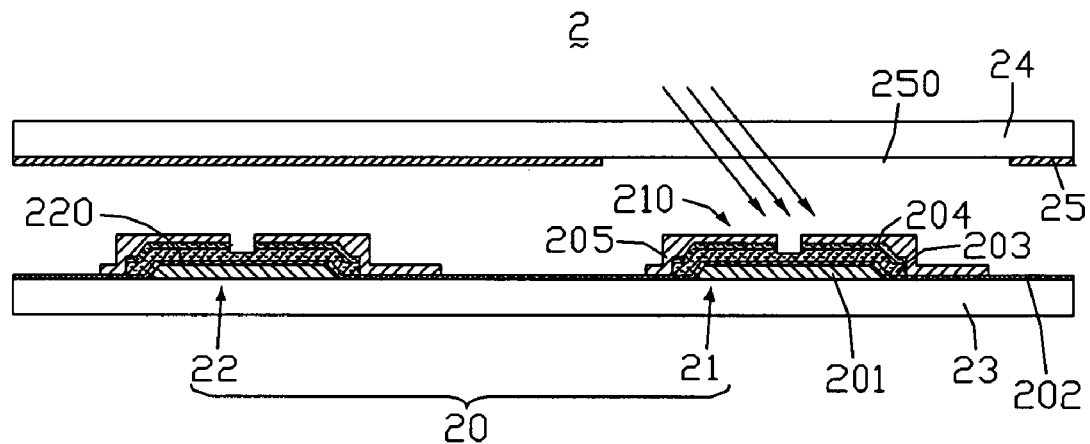
FIG. 1 is a side cross-sectional view of part of a non-display area of a display device according to a first embodiment of the present invention, the display device including a light sensor.

FIG. 1 is a side cross-sectional view of part of a non-display area of a display device 2 according to a first embodiment of the present invention. The display device 2 may for example be an LCD device. The display device 2 includes a light sensor 20, a black matrix 25, a first substrate 23, and a second substrate 24.

The first substrate 23 is parallel to the second substrate 24. The light sensor 20 is disposed on an inner surface of the first substrate 23. The light sensor 20 includes a light-sensing unit 21 and a compensating unit 22, and the compensating unit 22 has a structure that is the same as the light-sensing unit 21. The light-sensing unit 21 is used for sensing light, and the compensating unit 22 is used for providing a reference value current for the light-sensing unit 21. The light-sensing unit 21 includes an amorphous silicon thin film transistor (TFT) 210, and the compensating unit 22 includes an amorphous silicon TFT 220. The amorphous silicon TFTs 210 and 220 have the same structure, and are made from a gate electrode layer 201, an insulating layer 202, an amorphous silicon layer 203, an N-doped amorphous silicon layer 204, and a source electrode and drain electrode semiconductor layer 205 formed on the inner surface of the first substrate 23 from bottom to top in that order. The amorphous silicon TFTs 210 and 220 may be formed in a same process with the TFT array of a display area (not shown) of the display device 1. The black matrix 25 is disposed on an inner surface of the second substrate 24. The black matrix 25 includes an opening 250 corresponding to the light-sensing unit 21. The black matrix 25 is used to shield the compensating unit 22 from ambient light, and the opening 250 is used to provide a light path for the light-sensing unit 21.

Figure 2:
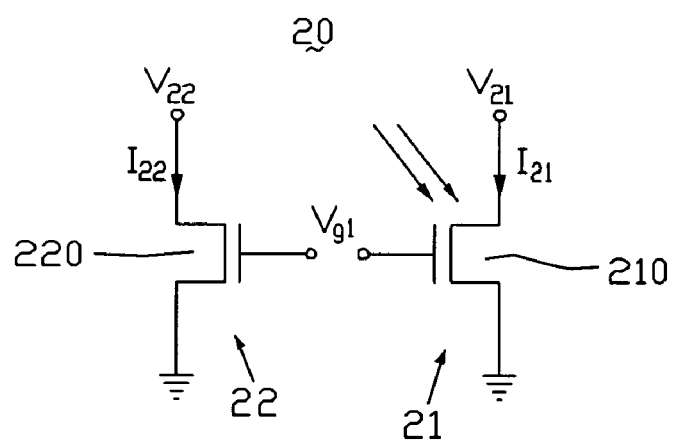
FIG. 2 is a circuit diagram of the light sensor of FIG. 1.

FIG. 2 is a circuit diagram of the light sensor 20. The amorphous silicon TFTs 210 and 220 respectively include a gate electrode (not labeled), a drain electrode (not labeled), and a source electrode (not labeled). A gate voltage $V_{g1}$ is supplied to the gate electrodes of the amorphous silicon TFTs 210 and 220, a fixed voltage $V_{21}$ is supplied to the drain electrode of the amorphous silicon TFT 210, and a fixed voltage $V_{22}$ is supplied to the drain electrode of the amorphous silicon TFT 220. The source electrodes of the amorphous silicon TFTs 210 and 220 are grounded.

When the amorphous silicon TFT 210 is not irradiated by ambient light, a drain current $I_{21}$ flows through the drain electrode of the amorphous silicon TFT 210, and a drain current $I_{22}$ flows through the drain electrode of the amorphous silicon TFT 220. When the amorphous silicon TFT 210 is irradiated by ambient light, the drain current $I_{21}$ increases, and the amount of the increase depends on the quantity of light received by the amorphous silicon TFT 210. However, because the black matrix 25 shields the compensating unit 22 from ambient light, the amorphous silicon TFT 220 is not irradiated by the ambient light, and the drain current $I_{22}$ of the amorphous silicon TFT 220 is not changed. An external control circuit (not shown) measures and compares the drain currents $I_{21}$ and $I_{22}$, calculates a result according to a function of the drain currents $I_{21}$ and $I_{22}$, generates a corresponding control signal, and adjusts the brightness of a light source (not shown) of the display device 2 according to the control signal. Thereby, a brightness of the light beams emitted by the light source corresponds with the brightness of the ambient light.

Because the light-sensing unit 21 and the compensating unit 22 have the same structure, the amorphous silicon TFTs 210 and 220 are made of same material. Even if the light-sensing unit 21 is influenced by ambient environment conditions (e.g. change in temperature) that change the internal element parameters of the light-sensing unit 21, the internal element parameters of the compensating unit 22 undergo the same change. Therefore, the compensating unit 22 provides the drain current $I_{22}$ as the reference value to the external control circuit, and the external control circuit can accurately adjust the brightness of the light source to correspond with the brightness of the ambient light. Furthermore, the light sensor 20 is formed on the first substrate 23 in a same process with the TFT array of the display area of the display device 1. This simplifies the overall process of fabricating the display device 2, and lowers costs.

The light-sensing unit 21 and the compensating unit 22 can further include more amorphous silicon TFTs, respectively. Nevertheless, the number of amorphous silicon TFTs of the light-sensing unit 21 is equal to that of the compensating unit 22. The gate voltage $V_{g1}$ is supplied to all the gate electrodes of the amorphous silicon TFTs, the fixed voltage $V_{21}$ is supplied to all the drain electrodes of the amorphous silicon TFTs of the light-sensing unit 21, and the fixed voltage $V_{22}$ is supplied to all the drain electrodes of the amorphous silicon TFTs of the compensating unit 22. The source electrodes of all the amorphous silicon TFTs are grounded. All the amorphous silicon TFTs of the light-sensing unit 21 are used for receiving the ambient light. A sum of the drain currents of all the amorphous silicon TFTs of the compensating unit 22 is used as the reference value. The reference value and a sum of the drain currents of all the amorphous silicon TFTs of the light-sensing unit 21 are provided to the external control circuit. In a typical embodiment, the two sum currents are large enough to be measured conveniently by the external control circuit without the need for an amplifying circuit.

Figure 3:
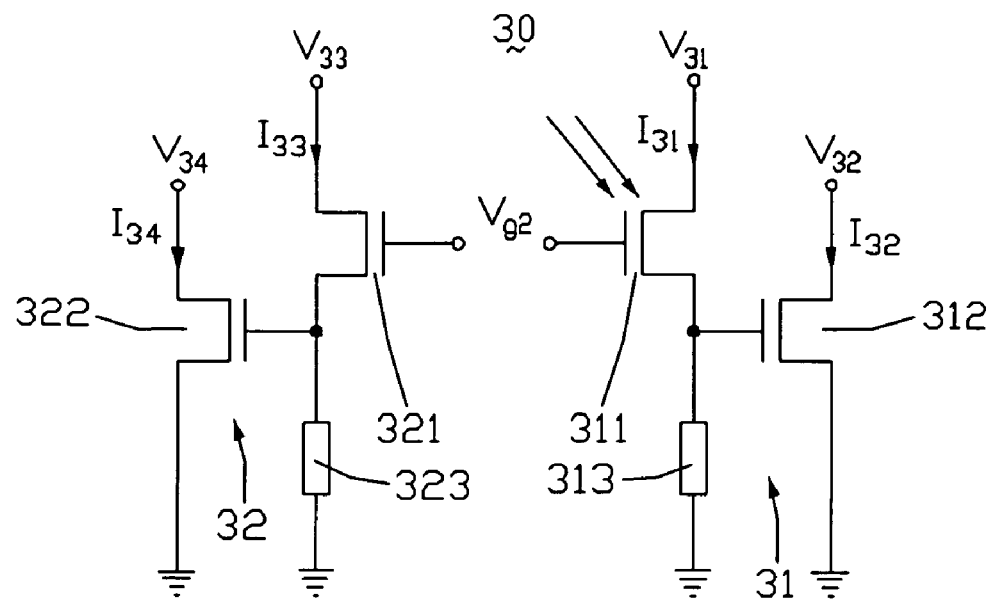
FIG. 3 is a circuit diagram of a light sensor of a display device according to a second embodiment of the present invention.

FIG. 3 is a circuit diagram of a light sensor 30 of a display device according to a second embodiment of the present invention. The light sensor 30 includes a light-sensing unit 31 and a compensating unit 32, and the compensating unit 32 has a structure that is the same as the light-sensing unit 31. The light-sensing unit 31 is used for sensing light, and the compensating unit 32 is used for providing a reference value current for the light-sensing unit 31. The light-sensing unit 31 includes two amorphous silicon TFTs 311, 312, and a resistor 313 that functions as a voltage-dividing element. The compensating unit 32 includes two amorphous silicon TFTs 321, 322, and a resistor 323 that functions as a voltage-dividing element.

A fixed voltage $V_{31}$ is supplied to a drain electrode (not labeled) of the amorphous silicon TFT 311, a fixed voltage $V_{32}$ is supplied to a drain electrode (not labeled) of the amorphous silicon TFT 312, a fixed voltage $V_{33}$ is supplied to a drain electrode (not labeled) of the amorphous silicon TFT 321, and a fixed voltage $V_{34}$ is supplied to a drain electrode (not labeled) of the amorphous silicon TFT 322. A gate voltage $V_{g2}$ is supplied to gate electrodes (not labeled) of the amorphous silicon TFTs 311, 321. A source electrode (not labeled) of the amorphous silicon TFT 311 is connected to a gate electrode (not labeled) of the amorphous silicon TFT 312, and is grounded via the resistor 313. A source electrode (not labeled) of the amorphous silicon TFT 321 is connected to a gate electrode (not labeled) of the amorphous silicon TFT 322, and is grounded via the resistor 323. Source electrodes (not labeled) of the amorphous silicon TFTs 312, 322 are grounded.

The amorphous silicon TFT 311 is used for receiving ambient light. The resistors 313, 323 are used for dividing the fixed voltages $V_{31}$, $V_{33}$ respectively, and supplying gate voltages to the amorphous silicon TFTs 312, 322 respectively. When the amorphous silicon TFT 311 is irradiated by the ambient light, the internal impedance of the amorphous silicon TFT 311 decreases, a drain current $I_{31}$ of the amorphous silicon TFT 311 increases, the gate voltage of the amorphous silicon TFT 312 increases, and a drain current $I_{32}$ of the amorphous silicon. TFT 312 increases. Due to the amplification effects of the amorphous silicon TFTs 312, 322, the drain current $I_{32}$ of the amorphous silicon TFT 312 is larger than the drain current $I_{31}$ of the amorphous silicon TFT 311, and a drain current $I_{34}$ of the amorphous silicon TFT 322 is larger than a drain current $I_{33}$ of the amorphous silicon TFT 321. Therefore an external control circuit (not shown) can accurately adjust the brightness of a light source of the display device to correspond with the brightness of the ambient light via measuring and comparing the drain currents $I_{32}$ and $I_{34}$, without the need for an amplifying circuit.

Figure 4:
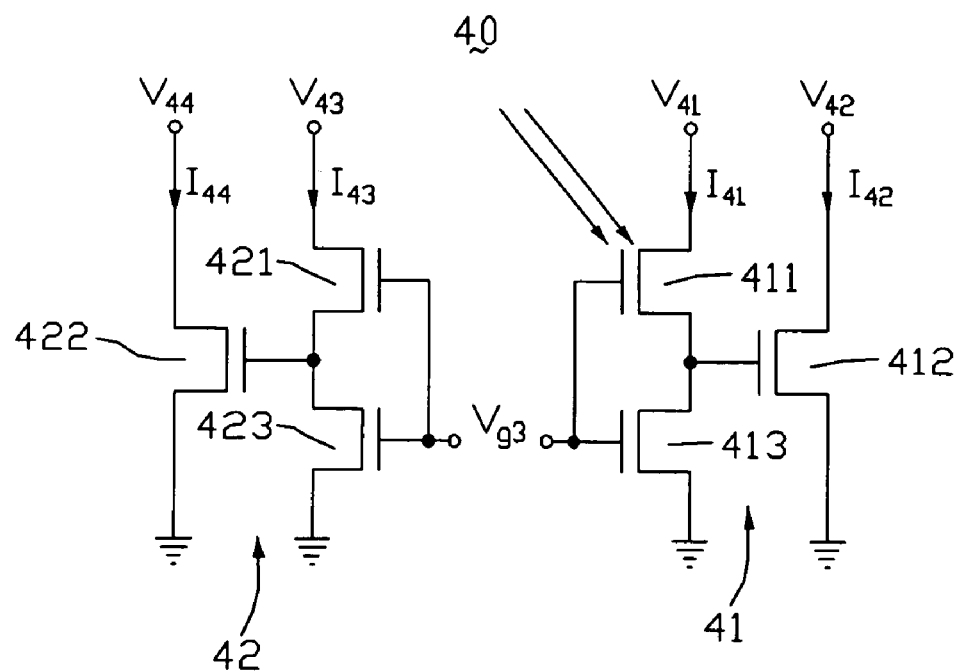
FIG. 4 is a circuit diagram of a light sensor of a display device according to a third embodiment of the present invention.

FIG. 4 is a circuit diagram of a light sensor 40 of a display device according to a third embodiment of the present invention. The light sensor 40 includes a light-sensing unit 41 and a compensating unit 42, and the compensating unit 42 has a structure that is the same as the light-sensing unit 41. The light-sensing unit 41 is used for sensing light, and the compensating unit 42 is used for providing a reference value current for the light-sensing unit 41. The light-sensing unit 41 includes three amorphous silicon TFTs 411, 412, and 413. The compensating unit 42 includes three amorphous silicon TFTs 421, 422, and 423.

A fixed voltage $V_{41}$ is supplied to a drain electrode (not labeled) of the amorphous silicon TFT 411, a fixed voltage $V_{42}$ is supplied to a drain electrode (not labeled) of the amorphous silicon TFT 412, a fixed voltage $V_{43}$ is supplied to a drain electrode (not labeled) of the amorphous silicon TFT 421, and a fixed voltage $V_{44}$ is supplied to a drain electrode (not labeled) of the amorphous silicon TFT 422. A gate voltage $V_{g3}$ is supplied to gate electrodes (not labeled) of the amorphous silicon TFTs 411, 413, 421, and 423. A source electrode (not labeled) of the amorphous silicon TFT 411 is connected to a gate electrode (not labeled) of the amorphous silicon TFT 412 and a drain electrode (not labeled) of the amorphous silicon TFT 413. A source electrode (not labeled) of the amorphous silicon TFT 421 is connected to a gate electrode (not labeled) of the amorphous silicon TFT 422 and a drain electrode (not labeled) of the amorphous silicon TFT 423. Source electrodes (not labeled) of the amorphous silicon TFTs 412, 413, 422, and 423 are grounded.

The amorphous silicon TFT 411 is used for receiving ambient light. The amorphous silicon TFTs 413, 423 function as voltage-dividing elements. That is, the amorphous silicon TFTs 413, 423 are used for dividing the fixed voltages $V_{41}$, $V_{43}$ respectively, and supplying gate voltages to the amorphous silicon TFTs 412, 422 respectively. When the amorphous silicon TFT 411 is irradiated by the ambient light, the internal impedance of the amorphous silicon TFT 411 decreases, a drain current $I_{41}$ of the amorphous silicon TFT 411 increases, the gate voltage of the amorphous silicon TFT 412 increases, and a drain current $I_{42}$ of the amorphous silicon TFT 412 increases. Due to the amplification effects of the amorphous silicon TFTs 412, 422, the drain current $I_{42}$ of the amorphous silicon TFT 412 is larger than the drain current $I_{41}$ of the amorphous silicon TFT 411, and a drain current $I_{44}$ as the reference of the amorphous silicon TFT 422 is larger than a drain current $I_{43}$ of the amorphous silicon TFT 421. Therefore, an external control circuit (not shown) can accurately adjust the brightness of a light source of the display device to correspond with the brightness of the ambient light via measuring and comparing the drain currents $I_{42}$ and $I_{44}$, without the need for an amplifying circuit.

Figure 5:
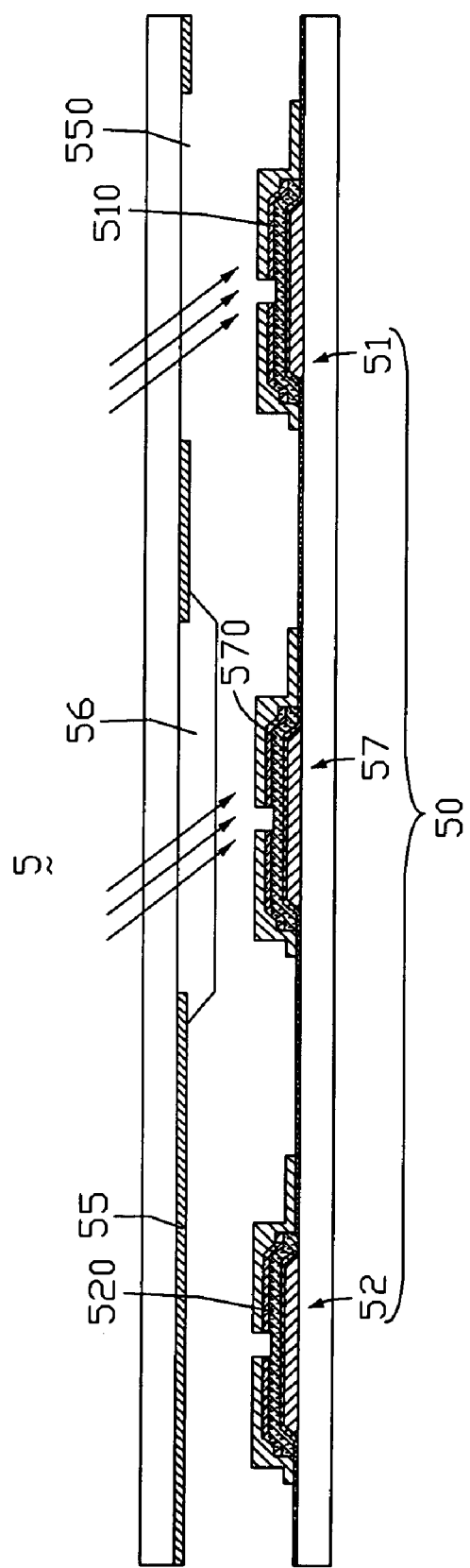
FIG. 5 is a side cross-sectional view of part of a non-display area of a display device according to a fourth embodiment of the present invention, the display device including a light sensor.

FIG. 5 is a side cross-sectional view of part of a non-display area of a display device 5 according to a fourth embodiment of the present invention. The display device 5 is similar to the display device 1, and may for example be an LCD device. However, the display device 5 further includes a color filter 56. The color filter 56 and a black matrix 55 are disposed alternately across the inner side of a second substrate (not labeled) of the display device 5. A light sensor 50 of the display device 5 includes a first light-sensing unit 51, a second light-sensing unit 57, and a compensating unit 52. The compensating unit 52, the first light-sensing unit 51, and the second light-sensing unit 57 have the same structure. The first and second light-sensing units 51, 57 are used for sensing different lights. The compensating unit 52 is used for providing a reference value current for the first and second light-sensing units 51, 57. The black matrix 55 is used to shield the compensating unit 52 from ambient light, an opening 550 of the black matrix 55 is used to provide a light path for the first light-sensing unit 51, and the color filter 56 is used to provide a light path for the second light-sensing unit 57. The first light-sensing unit 51 includes an amorphous silicon TFT 510, the second light-sensing unit 57 includes an amorphous silicon TFT 570, and the compensating unit 52 includes an amorphous silicon TFT 520. The amorphous silicon TFT 510 is disposed corresponding to the opening 550, and is used for receiving ambient light through the opening 550. The amorphous silicon TFT 570 is disposed corresponding to the color filter 56, and is used for receiving ambient light through the color filter 56.

Figure 6:
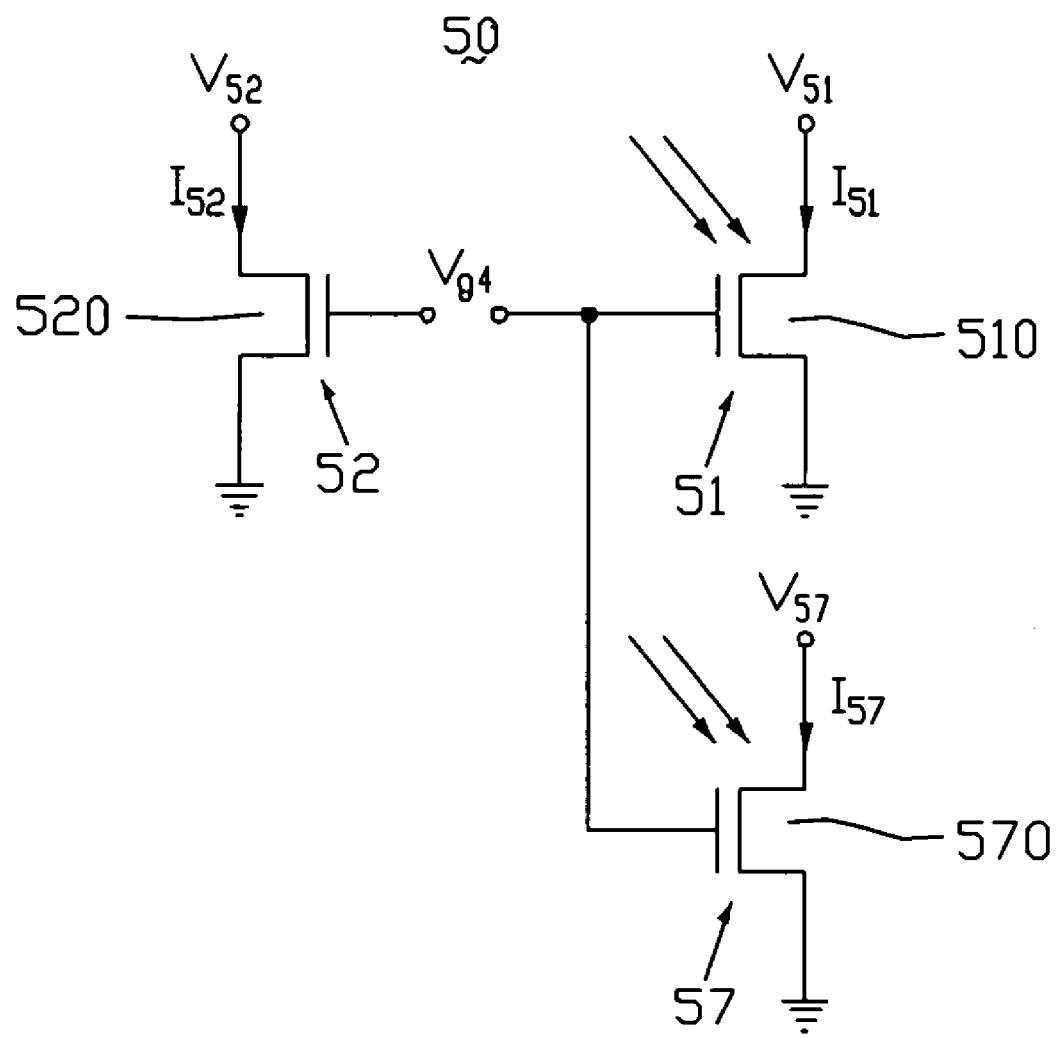
FIG. 6 is a circuit diagram of the light sensor of FIG. 5.

FIG. 6 is a circuit diagram of the light sensor 50. A gate voltage $V_{g4}$ is supplied to gate electrodes (not labeled) of the amorphous silicon TFTs 510, 570, and 520. A fixed voltage $V_{51}$ is supplied to a drain electrode (not labeled) of the amorphous silicon TFT 510, a fixed voltage $V_{52}$ is supplied to a drain electrode (not labeled) of the amorphous silicon TFT 520, and a fixed voltage $V_{57}$ is supplied to a drain electrode (not labeled) of the amorphous silicon TFT 570. Source electrodes (not labeled) of the amorphous silicon TFTs 510, 570, and 520 are grounded.

An external control circuit (not shown) measures a drain current $I_{51}$ of the amorphous silicon TFT 510, a drain current $I_{57}$ of the amorphous silicon TFT 570, and a drain current $I_{52}$ of the amorphous silicon TFT 520 as the reference value, respectively. Then the external control circuit calculates two results according to a function of the drain currents $I_{51}$ and $I_{52}$ and a function of the drain currents $I_{57}$ and $I_{52}$, respectively, compares the two results, generates a corresponding control signal, and adjusts the brightness of a light source (not shown) of the display device 5 according to the control signal. Thereby, a brightness of the light beams emitted by the light source corresponds with the brightness of the ambient light.

Figure 7:
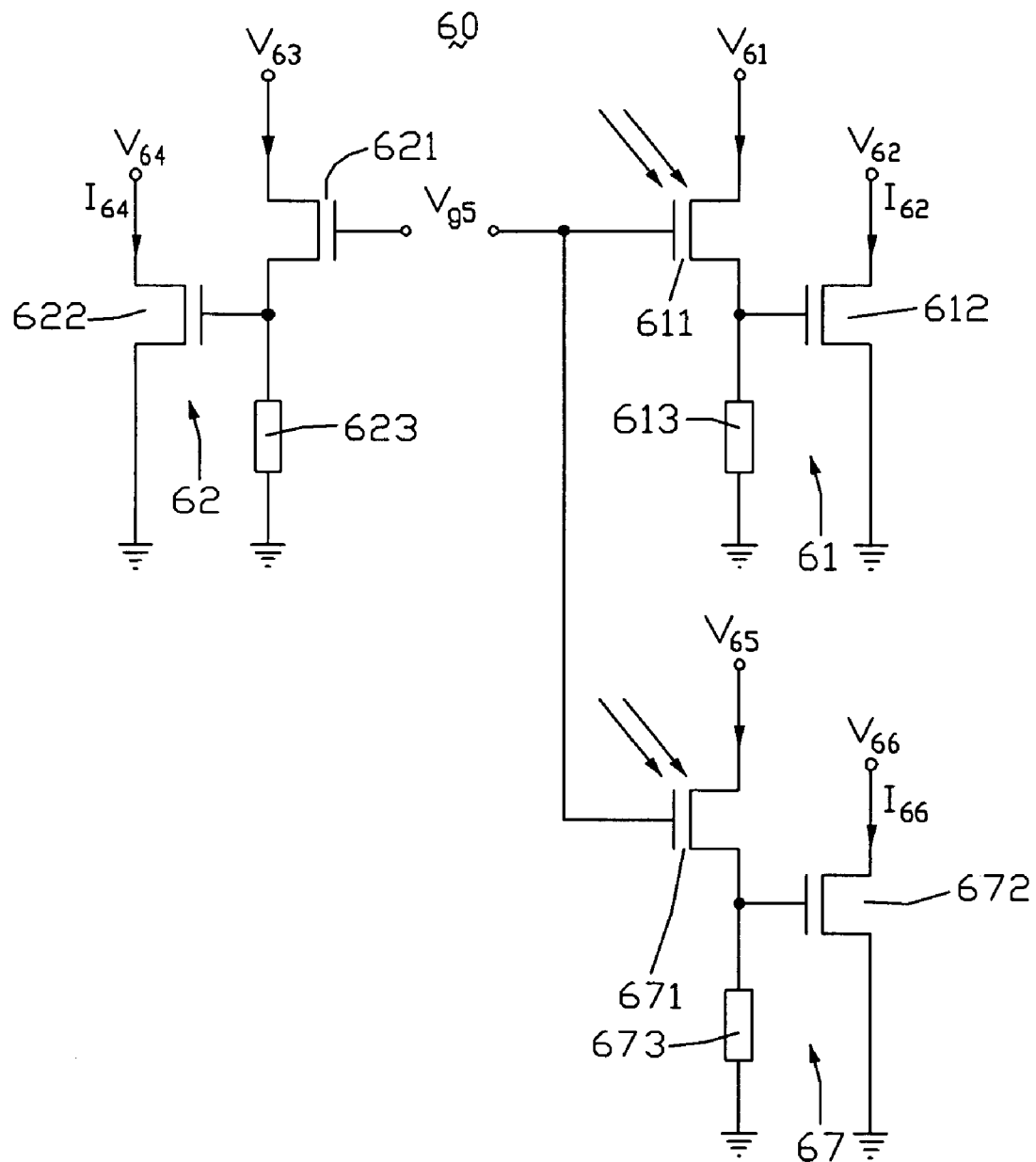
FIG. 7 is a circuit diagram of a light sensor of a display device according to a fifth embodiment of the present invention.

FIG. 7 is a circuit diagram of a light sensor 60 of a display device according to a fifth embodiment of the present invention. The light sensor 60 includes a first light-sensing unit 61, a second light-sensing unit 67, and a compensating unit 62.

The compensating unit 62, the first light-sensing unit 61, and the second light-sensing unit 67 have the same structure. The first and second light-sensing units 61, 67 are used for sensing ambient light at two selected different locations on the display device. The compensating unit 62 is used for providing a reference value current for the first and second light-sensing units 61, 67. The first light-sensing unit 61 includes two amorphous silicon TFTs 611, 612, and a resistor 613 that functions as a voltage-dividing element. The second light-sensing unit 67 includes two amorphous silicon TFTs 671, 672, and a resistor 673 that functions as a voltage-dividing element. The compensating unit 62 includes two amorphous silicon TFTs 621, 622, and a resistor 623 that functions as a voltage-dividing element.

A fixed voltage $V_{61}$ is supplied to a drain electrode (not labeled) of the amorphous silicon TFT 611, and a fixed voltage $V_{62}$ is supplied to a drain electrode (not labeled) of the amorphous silicon TFT 612. A fixed voltage $V_{63}$ is supplied to a drain electrode (not labeled) of the amorphous silicon TFT 621, and a fixed voltage $V_{64}$ is supplied to a drain electrode (not labeled) of the amorphous silicon TFT 622. A fixed voltage $V_{65}$ is supplied to a drain electrode (not labeled) of the amorphous silicon TFT 671, and a fixed voltage $V_{66}$ is supplied to a drain electrode (not labeled) of the amorphous silicon TFT 672. A gate voltage $V_{g5}$ is supplied to gate electrodes (not labeled) of the amorphous silicon TFTs 611, 621, and 671. A source electrode (not labeled) of the amorphous silicon TFT 611 is connected to a gate electrode (not labeled) of the amorphous silicon TFT 612, and is grounded via the resistor 613. A source electrode (not labeled) of the amorphous silicon TFT 621 is connected to a gate electrode (not labeled) of the amorphous silicon TFT 622, and is grounded via the resistor 623. A source electrode (not labeled) of the amorphous silicon TFT 671 is connected to a gate electrode (not labeled) of the amorphous silicon TFT 672, and is grounded via the resistor 673. Source electrodes (not labeled) of the amorphous silicon TFTs 612, 622, and 672 are grounded.

An external control circuit (not shown) measures a drain current $I_{62}$ of the amorphous silicon TFT 612, a drain current $I_{66}$ of the amorphous silicon TFT 672, and a drain current $I_{64}$ of the amorphous silicon TFT 622 as the reference value without an amplifying circuit, respectively. Then the external control circuit calculates two results according to a function of the drain currents $I_{62}$ and $I_{64}$ and to a function of the drain currents $I_{66}$ and $I_{64}$, respectively, compares the two results, generates a corresponding control signal, and adjusts the brightness of a light source (not shown) of a display device according to the control signal. Thereby, a brightness of the light beams emitted by the light source corresponds with the brightness of the ambient light.

Figure 8:
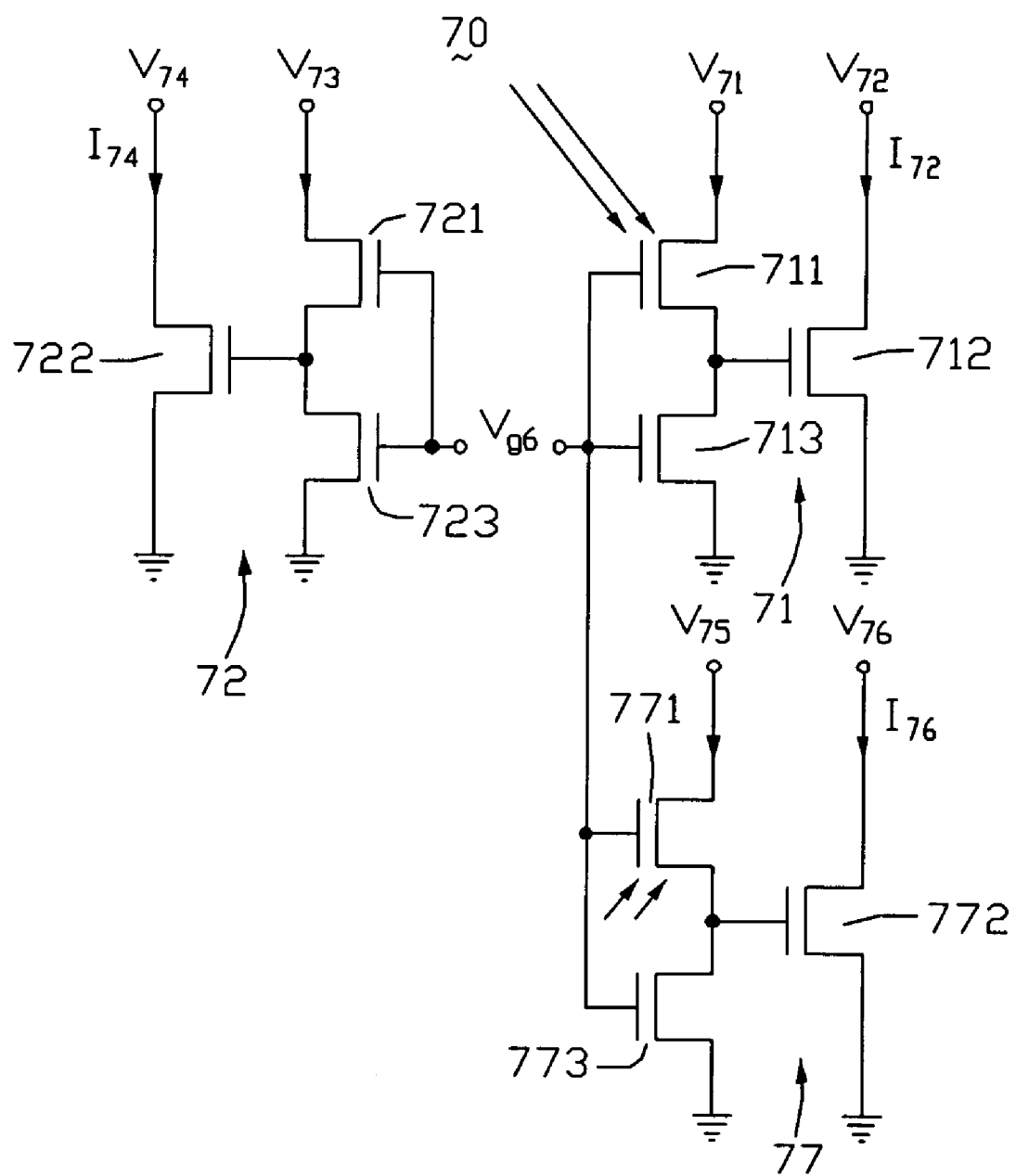
FIG. 8 is a circuit diagram of a light sensor of a display device according to a sixth embodiment of the present invention.
Figure 9:
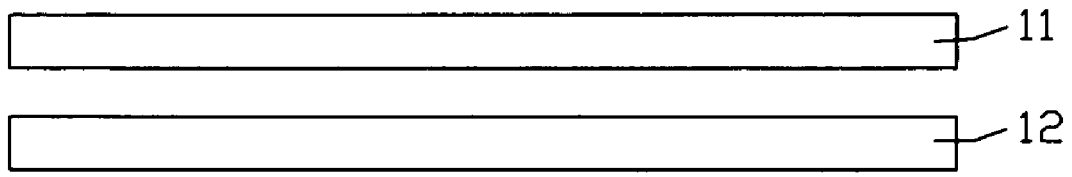
FIG. 9 is an exploded, side cross-sectional view of a conventional LCD device, the LCD device including a backlight module.
Figure 10:
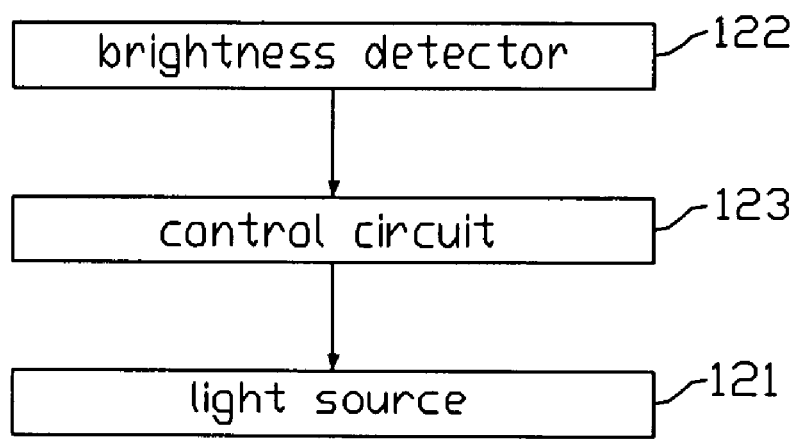
FIG. 10 is a block diagram of components of the backlight module of FIG. 9.

FIG. 8 is a circuit diagram of a light sensor 70 of a display device according to a fifth embodiment of the present invention. The light sensor 70 includes a first light-sensing unit 71, a second light-sensing unit 77, and a compensating unit 72. The compensating unit 72, the first light-sensing unit 71, and the second light-sensing unit 77 have the same structure. The first and second light-sensing units 71, 77 are used for sensing ambient light at two selected different locations on the display device. The compensating unit 72 is used for providing a reference value for the first and second light-sensing units 71, 77. The first light-sensing unit 71 includes three amorphous silicon TFTs 711, 712, and 713. The second light-sensing unit 77 includes three amorphous silicon TFTs 771, 772, and 773. The compensating unit 72 includes three amorphous silicon TFTs 721, 722, and 723.

A fixed voltage $V_{71}$ is supplied to a drain electrode (not labeled) of the amorphous silicon TFT 711, and a fixed voltage $V_{72}$ is supplied to a drain electrode (not labeled) of the amorphous silicon TFT 712. A fixed voltage $V_{73}$ is supplied to a drain electrode (not labeled) of the amorphous silicon TFT 721, and a fixed voltage $V_{74}$ is supplied to a drain electrode (not labeled) of the amorphous silicon TFT 722. A fixed voltage $V_{75}$ is supplied to a drain electrode (not labeled) of the amorphous silicon TFT 771, and a fixed voltage $V_{76}$ is supplied to a drain electrode (not labeled) of the amorphous silicon TFT 772. A gate voltage $V_{g6}$ is supplied to gate electrodes (not labeled) of the amorphous silicon TFTs 711, 713, 721, 723, 771, and 773. A source electrode (not labeled) of the amorphous silicon TFT 711 is connected to a gate electrode (not labeled) of the amorphous silicon TFT 712 and a drain electrode (not labeled) of the amorphous silicon TFT 713. A source electrode (not labeled) of the amorphous silicon TFT 721 is connected to a gate electrode (not labeled) of the amorphous silicon TFT 722 and a drain electrode (not labeled) of the amorphous silicon TFT 723. A source electrode (not labeled) of the amorphous silicon TFT 771 is connected to a gate electrode (not labeled) of the amorphous silicon TFT 772 and a drain electrode (not labeled) of the amorphous silicon TFT 773. Source electrodes (not labeled) of the amorphous silicon TFTs 712, 713, 722, 723, 772, and 773 are grounded.

An external control circuit (not shown) measures a drain current $I_{72}$ of the amorphous silicon TFT 712, a drain current $I_{76}$ of the amorphous silicon TFT 772, and a drain current $I_{74}$ of the amorphous silicon TFT 722 as the reference value without an amplifying circuit, respectively. Then the external control circuit calculates two results according to a function of the drain currents $I_{72}$ and $I_{74}$ and to a function of the drain currents $I_{76}$ and $I_{74}$, respectively, compares the two results, generates a corresponding control signal, and adjusts the brightness of a light source (not shown) of the display device according to the control signal. Thereby, a brightness of the light beams emitted by the light source corresponds with the brightness of the ambient light.

It is to be understood, however, that even though numerous characteristics and advantages of preferred and exemplary embodiments have been set out in the foregoing description, together with details of the structures and functions of the embodiments, the disclosure is illustrative only; and that changes may be made in detail, especially in matters of shape, size, and arrangement of parts within the principles of the present invention to the full extent indicated by the broad general meaning of the terms in which the appended claims are expressed.

What is claimed is:

1. A light sensor assembly, comprising:
   a supporting base;
   a light-sensing portion provided at least one first location of the supporting base where ambient light is received, the light-sensing portion comprising a first light-sensing unit; and
   a compensating unit provided at a second location of the supporting base shielded from ambient light, the compensating unit having a structure that is the same as the first light-sensing unit;
   wherein the light-sensing portion comprises at least one amorphous silicon thin film transistor (TFT) configured for sensing the ambient light, and the compensating unit is configured for providing a reference value current for the light-sensing portion.

2. The light sensor assembly as claimed in claim 1, wherein the at least one amorphous silicon TFT comprises a first amorphous silicon TFT, the first light-sensing unit comprises the first amorphous silicon TFT, the compensating unit comprises a second amorphous silicon TFT, a drain electrode of the first amorphous silicon TFT is configured for receiving a first fixed voltage, a drain electrode of the second amorphous silicon TFT is configured for receiving a second fixed voltage, two gate electrodes of the first and second amorphous silicon TFTs are configured for receiving a gate voltage, and two source electrodes of the first and second amorphous silicon TFTs are grounded.

3. The light sensor assembly as claimed in claim 2, wherein drain currents of the first and second amorphous silicon TFTs are output for measurement by a control circuit.

4. The light sensor assembly as claimed in claim 2, wherein the light-sensing portion further comprises a second light-sensing unit, the second light-sensing unit having a structure that is the same as the first light-sensing unit, the second light-sensing unit comprises a third amorphous silicon TFT, a drain electrode of the third amorphous silicon TFT is configured far receiving a third fixed voltage, a gate electrode of the third amorphous silicon TFT is configured for receiving the gate voltage, and a source electrode of the third amorphous silicon TFT is grounded.

5. The light sensor assembly as claimed in claim 4, wherein the at least one first location is two first locations, the first and third amorphous silicon TFTs correspond to the two first locations respectively, and drain currents of the first, second, and third amorphous silicon TFTs are output for measurement by a control circuit.

6. The light sensor assembly as claimed in claim 2, wherein the first light-sensing unit further comprises a third amorphous silicon TFT and a first voltage-dividing element, the compensating unit further comprises a fourth amorphous silicon TFT and a second voltage-dividing element, the source electrode of to first amorphous silicon TFT is grounded via the first voltage-dividing element and is coupled to a gate electrode of the third amorphous silicon TFT, a drain electrode of the third amorphous silicon TFT is configured for receiving a third fixed voltage, a source electrode of the third amorphous silicon TFT is grounded, the source electrode of the second amorphous silicon TFT is grounded via the second voltage-dividing element and is coupled to a gate electrode of the fourth amorphous silicon TFT, a drain electrode of the fourth amorphous silicon TFT is configured for receiving a fourth fixed voltage, and a source electrode of the fourth amorphous silicon TFT is grounded.

7. The light sensor assembly as claimed in claim 6, wherein drain currents of the third and fourth amorphous silicon TFTs are output for measurement by a control circuit.

8. The light sensor assembly as claimed in claim 6, wherein the light-sensing portion further comprises a second light-sensing unit, the second light-sensing unit having a structure that is the same as the first light-sensing unit, the second light-sensing unit comprises a fifth amorphous silicon TFT, a sixth amorphous silicon TFT, and a third voltage-dividing element, a drain electrode of the fifth amorphous silicon TFT is configured for receiving a fifth fixed voltage, a drain electrode of the sixth amorphous silicon TFT is configured for receiving a sixth fixed voltage, a gate electrode of the fifth amorphous silicon TFT is configured for receiving the gate voltage, a source electrode of the fifth amorphous silicon TFT is coupled to the gate electrode of the sixth amorphous silicon TFT and is grounded via the third voltage-dividing element, and a source electrode of the sixth amorphous silicon TFT is grounded.

9. The light sensor assembly as claimed in claim 8, wherein the at least one first location is two first locations, the first and fifth amorphous silicon TFTs correspond to the two first locations respectively, and drain currents of the third, fourth, and sixth amorphous silicon TFTs are output for measurement by a control circuit.

10. A display device, comprising:
a first substrate;
a second substrate parallel to the first substrate;
a black matrix disposed at an inner surface of the first substrate; and
a light sensor assembly disposed at an inner surface of the second substrate;
wherein the light sensor assembly comprises a light-sensing unit and a compensating unit, the compensating unit has a structure that is the same as the light-sensing unit, the black matrix comprises an opening, the opening is disposed corresponding to the light-sensing unit, the black matrix is configured for shielding the compensating unit from ambient light, the opening is configured for providing a light path for the light-sensing unit to receive the ambient light, and the compensating unit is configured for providing a reference value current for the light-sensing unit.

11. The display device as claimed in claim 10, wherein the light-sensing unit comprises a first amorphous silicon thin film transistor (TFT), the compensating unit comprises a second amorphous silicon TFT, a drain electrode of the first amorphous silicon TFT is configured for receiving a first fixed voltage, a drain electrode of the second amorphous silicon TFT is configured for receiving a second fixed voltage, two gate electrodes of the first and second amorphous silicon TFTs are configured for receiving a gate voltage, and two source electrodes of the first and second amorphous silicon TFTs are grounded.

12. The display device as claimed in claim 11, wherein the first amorphous silicon TFT is configured for sensing the ambient light through the opening, and drain currents of the first and second amorphous silicon TFTs are output for measurement by a control circuit.

13. The display device as claimed in claim 11, wherein the light-sensing unit further comprises a third amorphous silicon TFT and a first voltage-dividing element, the compensating unit further comprises a fourth amorphous silicon TFT and a second voltage-dividing element, the source electrode of the first amorphous silicon TFT is grounded via the first voltage-dividing element and is coupled to a gate electrode of the third amorphous silicon TFT, a drain electrode of the third amorphous silicon TFT is configured for receiving a third fixed voltage, a source electrode of the third amorphous silicon TFT is grounded, the source electrode of the second amorphous silicon TFT is grounded via the second voltage-dividing element and is coupled to a gate electrode of the fourth amorphous silicon TFT, a drain electrode of the fourth amorphous silicon TFT is configured for receiving a fourth fixed voltage, and a source electrode of the fourth amorphous silicon TFT is grounded.

14. The display device as claimed in claim 13, wherein the first amorphous silicon TFT is configured for sensing the ambient light through the opening, and drain currents of the third and fourth amorphous silicon TFTs are output for measurement by a control circuit.

15. A display device, comprising:
a first substrate;
a second substrate parallel to the first substrate;
a black matrix disposed at an inner surface of the first substrate;
a color filter disposed alternately with the black matrix at the inner surface of the first substrate, and a light sensor assembly disposed at an inner surface of the second substrate;

wherein the light sensor assembly comprises a first light-sensing unit, a second light-sensing unit, and a compensating unit, the compensating unit has a structure that is the same as each of the first and second light-sensing units, the black matrix comprises an opening, the opening is disposed corresponding to the first light-sensing unit, the black matrix is configured for shielding the compensating unit from ambient light, the opening is configured for providing a light path for the first light-sensing unit to receive the ambient light, the color filter is configured for providing a light path for the second light-sensing unit to receive the ambient light that passes through the color fitter, and the compensating unit is configured for providing a reference value current for the first and second light-sensing units.

16. The display device as claimed in claim 15, wherein the first light-sensing unit comprises a first amorphous silicon thin film transistor (TFT), the second light-sensing unit comprises a second amorphous silicon TFT, the compensating unit comprises a third amorphous silicon TFT, a drain electrode of the first light-sensing unit is configured for receiving a first fixed voltage, a drain electrode of the second light-sensing unit is configured for receiving a second fixed voltage, a drain electrode of the compensating unit is configured for receiving a third fixed voltage, gate electrodes of the first and second light-sensing units and the compensating unit are configured for receiving a gate voltage, and source electrodes of the first, second and third amorphous silicon TFTs are grounded.

17. The display device as claimed in claim 16, wherein the first and second amorphous silicon TFTs are configured for sensing the ambient light that passes through the opening and the color filter respectively, and drain currents of the first, second, and third amorphous silicon TFTs are output for measurement by a control circuit.

18. The display device as claimed in claim 16, wherein the first light-sensing unit further comprises a fourth amorphous silicon TFT and a first voltage-dividing element, the second light-sensing unit further comprises a fifth amorphous silicon TFT and a second voltage-dividing element, the compensating unit further comprises a sixth amorphous silicon TFT and a third voltage-dividing element, a drain electrode of the fourth amorphous silicon TFT is configured for receiving a fourth fixed voltage, a drain electrode of the fifth amorphous silicon TFT is configured for receiving a fifth fixed voltage, a drain electrode of the sixth amorphous silicon TFT is configured for receiving a sixth fixed voltage, the source electrode of the first amorphous silicon TFT is grounded via the first voltage-dividing element and is coupled to a gate electrode of the fourth amorphous silicon TFT, the source electrode of the second amorphous silicon TFT is grounded via the second voltage-dividing element and is coupled to a gate electrode of the fifth amorphous silicon TFT, the source electrode of the third amorphous silicon TFT is grounded via the third voltage-dividing element and is coupled to a gate electrode of the sixth amorphous silicon TFT, and source electrodes of the fourth, fifth, and sixth amorphous silicon TFTs are grounded.

19. The display device as claimed in claim 18, wherein the first and second amorphous silicon TFTs are configured for sensing the ambient light that passes through the opening and the color filter respectively, and drain currents of the fourth, fifth, and sixth amorphous silicon TFTs are output for measurement by a control circuit.

* * * * *